United States Patent [19]

Benoit-Gonin et al.

[11] 4,392,124
[45] Jul. 5, 1983

[54] ANALOG-DIGITAL CODER COMPRISING A CHARGE TRANSFER CODED VOLTAGE GENERATION

[75] Inventors: Roger Benoit-Gonin; Jean L. Berger; Jean L. Coutures, all of Paris, France

[73] Assignee: Thomson - CSF, Paris, France

[21] Appl. No.: 256,051

[22] Filed: Apr. 21, 1981

[30] Foreign Application Priority Data

Apr. 23, 1980 [FR] France .................. 80 09113

[51] Int. Cl.³ ............................ H03K 13/02
[52] U.S. Cl. ............... 340/347 AD; 340/347 DA
[58] Field of Search .......... 340/347 AD; 307/221 D; 357/24

[56] References Cited

U.S. PATENT DOCUMENTS

| | | | |
|---|---|---|---|
| 3,588,884 | 6/1971 | Quereshi | 340/347 AD |
| 3,626,408 | 12/1971 | Carbrey | 340/347 AD |
| 3,938,188 | 2/1976 | Fletcher | |
| 4,077,035 | 2/1978 | Yee | 340/347 AD |
| 4,306,221 | 12/1981 | Jiang | 340/347 AD |

FOREIGN PATENT DOCUMENTS 2336834 7/1977 France .
2351544 12/1977 France .

Primary Examiner—C. D. Miller
Attorney, Agent, or Firm—Roland Plottel

[57] ABSTRACT

This analog-ditigal coder determines the coefficients $a_0 \ldots a_n$ in two stages:

during the first stage, the generator processes voltages $V_R$ and $V_{Ri}$ with $i=1$ to $k-1$;

during the second stage, the generator processes the voltages $V_R$ and $V_{Ri}$ with $i=1$ to $n-k$.

A capacitive voltage divider ($2^k C$, $C$) preceded by two sample and hold means ($S_3$, $C_3$, $S_4$, $C_4$) assures the division by $2^k$ of the voltages processed during the second stage and their summation with the final voltage $V_{R(k-1)}$ produced during the first stage.

10 Claims, 2 Drawing Figures

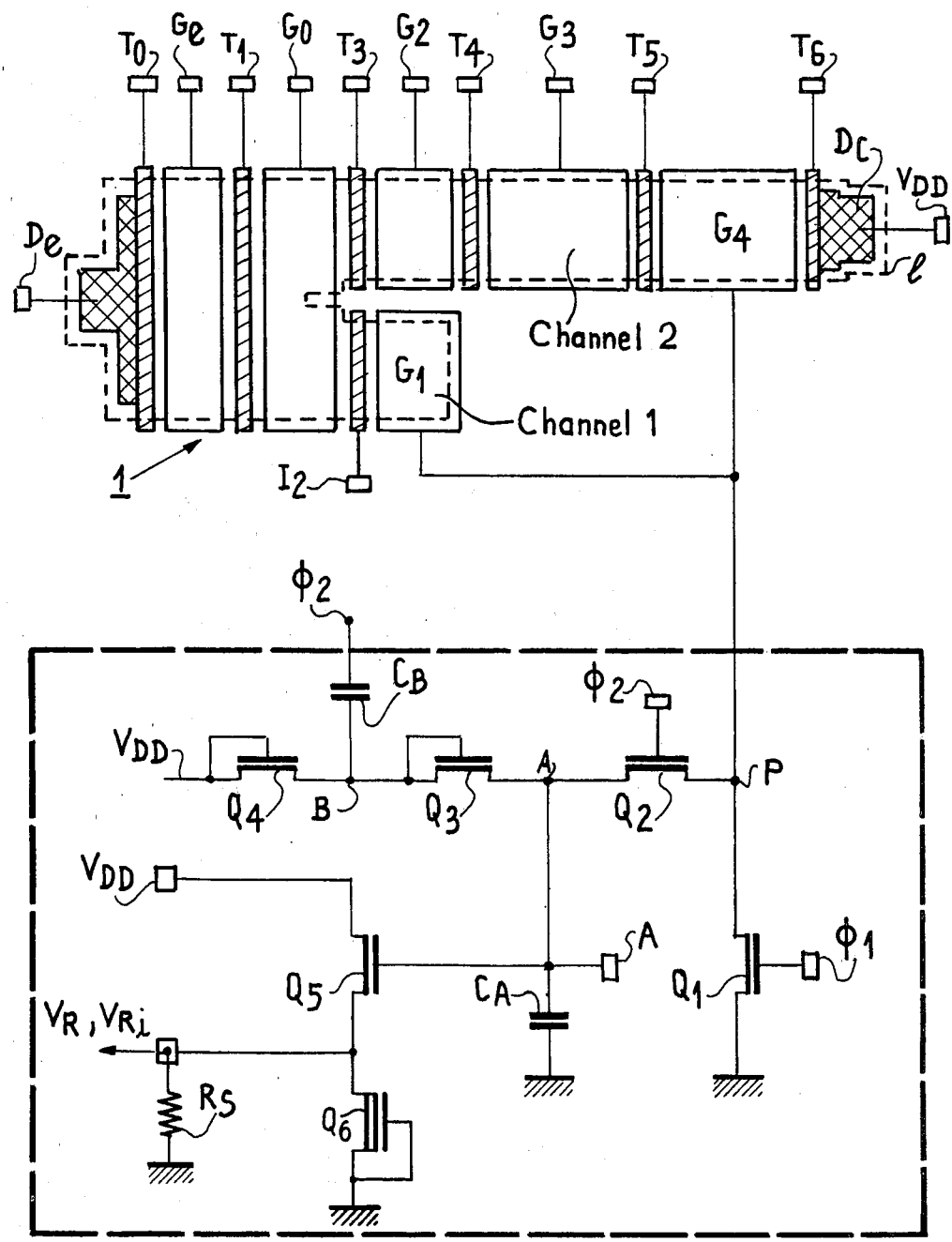
FIG_1

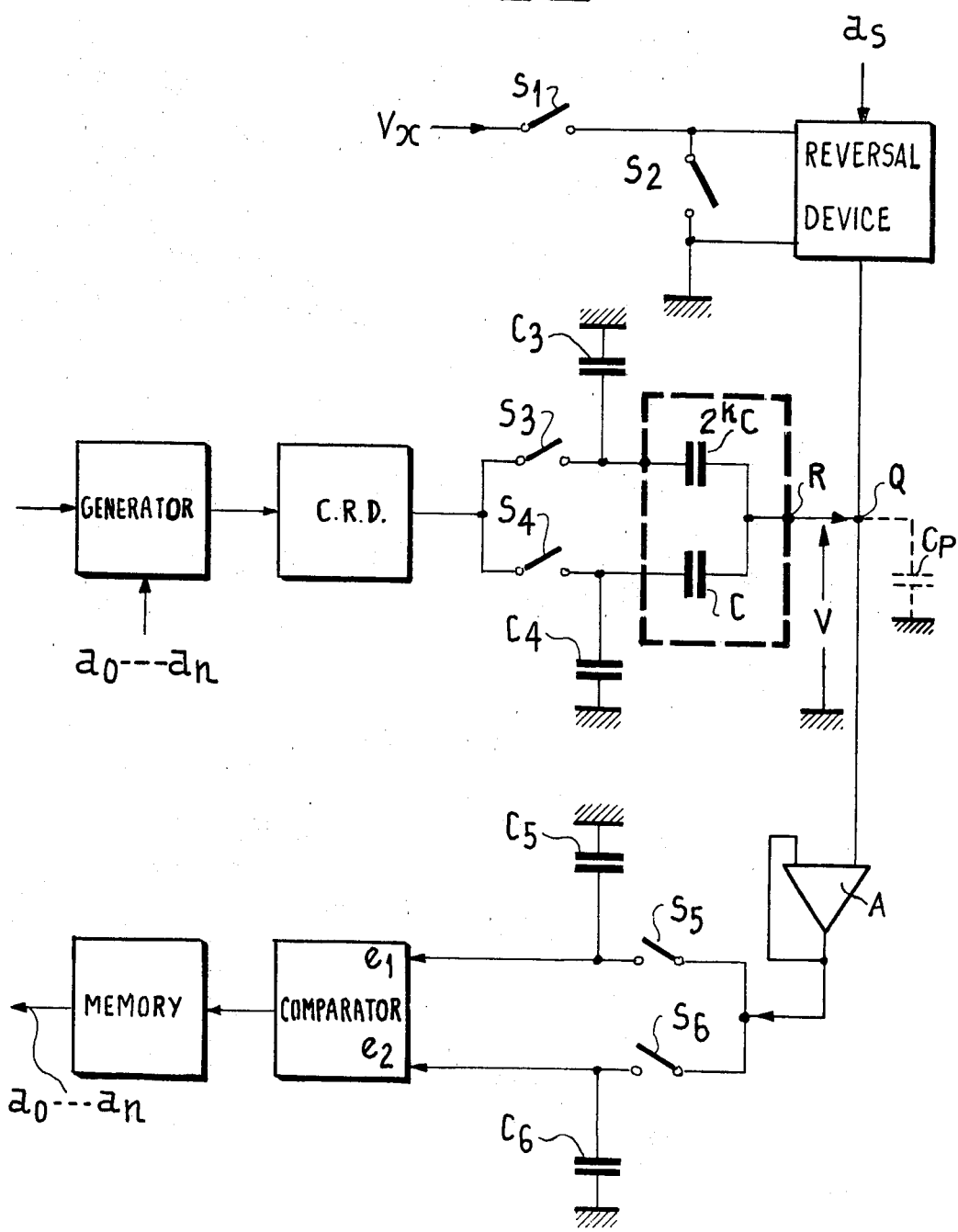
FIG_2

ANALOG-DIGITAL CODER COMPRISING A CHARGE TRANSFER CODED VOLTAGE GENERATION

BACKGROUND OF THE INVENTION

The present invention relates to an analog-digital coder comprising a charge transfer coded voltage generator.

It is well known in the art to determine by successive approximations the coefficients $a_0, a_1 \ldots a_i \ldots a_n$, equal to 0 or 1, making it possible to digitally code an unknown analog voltage $V_x$ by writing it in the form:

$$|V_x| = a_0 \cdot V_R + a_1 \cdot V_R/2 + a_2 \cdot V_R/2^2 + \ldots \\ + a_i \cdot V_R/2^i + \ldots + a_n \cdot V_R/2^n$$

in which $V_R$ is a reference voltage. For this purpose:

$|V_x|$ is firstly compared with $V_R$—if $|V_x|$ is less than $V_R$, then $a_0$ is equal to 0, otherwise it is equal to 1;

$|V_x|$ is then compared with $V_{R1} = a_0 V_R + V_R/2$—if $|VV_x|$ is less than $V_{R1}$, then $a_1$ is equal to 0, otherwise $a_1$ is equal to 1;

then $V_x|$ is compared to $V_{R2} = a_0 V_R + a_1 \cdot V_R/2 + V_R/4$—if $|V_x|$ is below $V_{R2}$, then $a_2$ equals 0, otherwise $a_2$ equals 1;

and so on until all the coefficients $a_0 \ldots a_n$ have been determined.

Thus, for determining by successive approximations the coefficients $a_0 \ldots a_n$ it is necessary to have the voltages $V_R$ and $$V_{Ri} = a_0 V_R + a_1 \cdot V_R/2 + a_2 \cdot V_R/2^2 + \ldots \\ + a_{i-1} \cdot V_R/2^{i-1} + V_R/2^i \text{ with } i = 1 \ldots n.$$

We know a charge transfer coded voltage generator which is shown in FIG. 1. It will be described in greater detail hereinafter and supplies the voltages $V_R$ and $V_{Ri}$. This generator for example is described in U.S. Pat. No. 4,350,976, assigned to Thomson-CSF.

A reference charge quantity $2Q_R$ is injected into the generator at the start of the processing of each sample $|V_x|$. This generator is constituted by a charge transfer device (CTD), which is divided up into two parallel channels. Half the charge in the CTD before division is collected in each channel.

A charge reading device (CRD) is connected to the two channels—to the storage grid $G_1$ following the division for the first channel and to the third storage grid $G_4$ following the division for the second channel.

The CRD then collects the quantity of charges $Q_R$ beneath $G_1$ and supplies the voltage $V_R$ and then coefficient $a_0$ can be determined. If $a_0 = 0$ the quantity of charges $Q_R$ stored in the second channel is discharged and if $a_0 = 1$ this charge quantity is stored beneath the second storage grid $G_3$ following the division of the CTD.

In all cases the charge quantity $Q_R$ stored beneath grid $G_1$ of the first channel performs a round trip on either side of the zone where the CTD is divided into two channels and thus a charge quantity $Q_R/2$ is stored beneath grids $G_1$ and $G_2$.

Thus, after the transfer of the possible content of $G_3$, which will be called $a_0 Q_R$ to beneath $G_4$, the CRD collects a charge quantity equal to $a_0 Q_R + Q_R/2$ and thus supplies $V_{R1}$ making it possible to determine $a_1$. This is continued until the determination of $a_n$ takes place after the processing of $V_{Rn}$.

The following problems occur when it is desired to provide an analog-digital coder with the charge transfer coded voltage generator in question. The coded voltage generator has the defects inherent in charge transfer devices and which essentially consist of the inefficiency of transfer, the dark current and the leakage current resulting from crystal imperfections or interface impurities (and particularly occurring with surface transfer CTD). However, the scale of these defects increases in the case of a coded voltage generator where an initial charge quantity $2Q_R$ has to perform n round trips on either side of the division of the CTD to finally obtain $Q_R/2^n$ and where the storage time for this charge quantity is therefore relatively long.

With regard to the inefficiency of transfer it is possible to use a CTD with a buried channel, whose transfer coefficient is substantially equal to 1, to within a few $10^{-5}$ units.

However, with regard to the dark and leakage currents it is necessary to limit the number n of successive divisions which can be validly performed, whilst retaining a final charge which is differentiated in a completely satisfactory manner from the thermal background noise.

A further problem is connected with the offset voltages appearing at all the active members adjacent to the generator for forming the coder, particularly when these members are constructed according to MOS technology.

BRIEF SUMMARY OF THE INVENTION

The present invention makes it possible to solve these problems. In the coders according to the present invention the determination by successive approximations of the coefficients $a_0 \ldots a_n$ takes place in two stages:

during the first stage the generator processes the voltages $V_R$ and $V_{Ri}$ with $i = 1$ to $k-1$, making it possible to determine the coefficients $a_0$ to $a_{k-1}$;

during the second stage the generator processes the voltages $V_R$ and $V_{Ri}$ with $i = 1$ to $n-k$;

the coder comprising means for ensuring on the one hand the division by $2^k$ of the processed voltages and on the other their summation with the voltage $V_{R(k-1)}$ produced at the end of the first stage.—thus, these means supply voltages $V_{Ri}$ with $i = k$ to $n$, which makes it possible to determine the coefficients $a_k$ to $a_n$.

Thus, according to the invention, by selecting $k = (n+1)/2$ the number of round trips of the reference charge quantity $2Q_R$ initially introduced into the generator is divided by two and the storage time in the CTD of this charge quantity is divided by two. It is pointed out that the coding of each sample $|V_x|$ requires the successive injection into the generator of two reference charge quantities $2Q_R$.

The invention makes it possible to obtain a coder with an increased precision or makes it possible to use CTD with lower performance levels with regard to the inefficiency of transfer, as well as the dark and leakage currents.

Finally according to a preferred embodiment the coder according to the invention compensates the offset voltages appearing at the active members.

BRIEF DESCRIPTION OF THE DRAWING

The invention is described in greater detail hereinafter relative to non-limitative embodiments and with reference to the attached drawings, wherein show:

FIG. 1: a plan view of the charge transfer coded voltage generator and the electrical diagram of the charge reading device (CRD), associated therewith, said generator and said CRD being used in the coder according to the invention.

FIG. 2: a diagrammatic view of the analog-digital coder according to the invention.

DETAILED DESCRIPTION OF THE PREFERRED EMBODIMENTS

In the drawings the same references designate the same elements, but for reasons of clarity the dimensions and proportions of the different elements have not been respected.

FIG. 1 is a plan view of the charge transfer device constituting the coded voltage generator used in the coder according to the invention, as well as the electrical diagram of the charge reading device, hereinafter called CRD which is associated therewith.

The charge transfer device is preferably of the charge coupled device type (CCD).

There can be either a surface or a volume charge transfer. Finally this device may or may not have a buried channel. The following description relates to the case of a CTD with a channel N created by the overdoping $P^+$ of a P-type substrate. In this case timing signals develop between the zero level and a high positive level. It is obviously possible to produce the CTD with a P channel in an N-type substrate.

The active area of the semiconductor substrate in which the transfer and storage of the charges takes place is located within the broken line 1. Outside the area delimited by this line substrate overdoping raises the inversion threshold and thus opposes any storage of charges.

At one end of the active area, to the left in the drawing, there is a diode $D_e$ making it possible to introduce a reference charge $2Q_R$ beneath a storage grid $G_e$ via a transfer grid $T_o$. Diode $D_e$ and grids $RT_o$ and $G_e$ constitute the device for injecting the reference charge $2Q_R$ into the generator, designated by the overall reference 1 in the drawing.

Diode $D_e$ is also used for the removal of surplus charges during the operation of the generator.

Grid $G_e$ is followed by a transfer grid $T_1$ and a storage grid $G_o$. Beneath $G_o$ an insulating diffusion advances to half the width of the active charge transfer area to carry out a pre-division of the charge stored beneath $G_o$ into two equal charge quantities. This insulating diffusion divides the active area following $G_o$ into two parallel channels which generally have the same width. Thus, two charge quantities equal to half the charge stored beneath $G_o$ are transferred beneath the storage grids $G_1$ and $G_2$ positioned on each channel after $G_o$ and separated from the latter by transfer grids $T_2$ and $T_3$. This division of a charge quantity by a diffused area is known from the prior art.

Thus, one of the channels is terminated by the storage grid $G_1$, whilst the other channel has, following the storage grid $G_2$, two storage grids $G_3$ and $G_4$ and three transfer grids $T_4$ between $G_2$ and $G_3$, $T_5$ between $G_3$ and $G_4$ and $T_6$ between $G_4$ and a collecting diode $D_c$. The collecting diode $D_c$, which terminates the channel, is connected to a d.c. voltage $V_{DD}$ and makes it possible to remove the charges at the end of processing a sample $V_x$.

Grids $G_1$ and $G_4$ are connected at a point P to the CRD, which performs a non-destructive reading of the charges stored beneath $G_1$ and $G_4$.

The CRD can be a current charge reading device known from the prior art, like that described in French Patent Application No. 77 13857, published as No. 2 389.899 in the name of THOMSON-CSF.

The potential at point P is kept constant during the arrival of the charges due to an MOS transistor $Q_2$ connected between point P and a point A. Transistor $Q_2$, controlled by a periodic timing signal $\phi_2$, is then polarized in saturation. The current traversing $Q_2$ during the influx of charges is integrated into a capacitor $C_A$ connected between point A and earth.

The voltage at point A is read by an MOS transistor or TMOS $Q_5$ in the form of a follow-up system, whose grid is connected to point A, whereof one of the electrodes is connected to a voltage $V_{DD}$ and whose other electrode supplies a reading voltage to the terminals of a resistor $R_S$ or to the drain of an MOS transistor $Q_6$. For reading the voltage at point A TMOS $Q_5$ can be replaced by an operational amplifier of gain 1 and with a high input impedance.

A TMOS $Q_3$, whose grid is connected to B is also connected between point A and point B. A capacitor $C_B$ is connected between point B and the timing signal $\phi_2$. Finally a TMOS $Q_4$ is connected between point B and the voltage $V_{DD}$, the grid of $Q_4$ also being connected to $V_{DD}$.

Finally a TMOS $Q_1$ is connected between grids $G_1$ and $G_4$ and earth. The TMOS $Q_1$ is controlled by a periodic timing signal $\phi_1$ and, when conductive, brings about the zeroing of the grids to which it is connected.

We will now study the operation of the generator shown in FIG. 1.

It is possible to differentiate five operating sequences.

These consist of sequence $t_o$ when a charge $2Q_R$ is introduced between grid $G_e$ in the form of the well-known "fill and spill" method. For this purpose diode $D_e$ is successively raised to a low level permitting the passage of charges from $D_e$ beneath $T_o$ and $G_e$, then to a high level permitting the storage of a given charge quantity $2Q_R$ beneath $G_e$. Grids $T_o$ and $G_e$ receive the same voltage $V_{GE}$. The reference charge quantity $2Q_R$ is stable to the first order, i.e. is independent of the voltage variations $V_{GE}$ applied to $T_o$ and $G_e$, if the surface potential curves as a function of the voltage of this pair of grids are parallel. To this end the threshold voltages beneath $T_o$ and $G_e$ are adjusted by implantation beneath $T_o$.

The other transfer electrodes of generator $T_1 \ldots T_6$ can be realized on an extra thickness of oxide. However, like $T_o$ they can also be produced by implantation or by any other known process.

This is followed by sequence $t_1$ when charge $2Q_R$ is transferred beneath $G_o$. The timing signal $\phi_2$ is at high level $V_\phi$ in such a way that the point B, initially pre-charged by $Q_4$ to $V_{DD}-V_T$ passes to $V_B=V_{DD}-V_T+V_\phi$ and point A is raised by $Q_3$ to $V_B-V_T$ in which $V_T$ is the threshold voltage common to the TMOS $Q_1$, $Q_2$, $Q_3$. Point P and grids $G_1$ and $G_4$ are pre-charged to $V_\phi-V_T$. The TMOS $Q_2$ is polarized in saturation because the potential at A $V_{AO}=V_B-V_T$ is greater than the potential at P $V_\phi-V_T$.

In sequence $T_2$ the charge $2Q_R$ present beneath $G_o$ is transferred to $G_1$ and $G_2$ by the zeroing of $G_o$, because grids $T_2$ and $T_3$ are at fixed intermediate potential. The charges are therefore transferred above the potential barriers induced beneath $T_2$ and $T_3$, which eliminates interference which could bring about the zeroing of $T_2$ and $T_3$ on reading grids $G_1$ and $G_2$.

Thus, charge $Q_R$ is beneath $G_1$ and charge $Q_R$ beneath $G_2$ due to the division of the charges performed by insulating diffusion.

At the same time $T_4$ and $G_3$ are zeroed and $T_5$ is brought to a fixed intermediate potential corresponding to the transfer of an optional charge from $G_3$ to $G_4$.

During the first sequence $t_2$ there are no charges to be transferred from $G_3$ to $G_4$ and it is the arrival of $Q_R$ beneath $G_1$ which brings about the passage of a current through $Q_2$, which maintains the potential at point P at $V_\phi - V_T$ by removing the charge from point P to point A, so that the potential at A passes from $V_{AO}$ to $V_A = -V_{AO} - Q_R/C_A = V_{AO} - V_R$.

Thus, by means of the TMOS $Q_5$ in the form of a follow-up system, there is a voltage $V_S$ proportional to $V_R = Q_R/C_A$. Voltage $V_R$ makes it possible for the coder according to the invention to supply the value of $a_o$:

$$a_o = 0 \text{ if } |V_X| < V_R$$

$$a_o = 1 \text{ if } |V_X| > V_R$$

This is followed by sequence $t_3$ and depending on the value of $a_o$ the charge transfers differ. If $a_o = 0$ charge $Q_R$ is transferred from $G_2$ beneath $G_o$ and then below $G_e$ and is finally removed by diode $D_e$. If $a_o = 1$ charge $Q_R$ is transferred from $G_2$ to beneath $G_3$ and the charge $a_o Q_R$ is then stored beneath $G_3$.

The final sequence is $t_4$ with the passage of $\phi_1$ to high level and $\phi_2$ to low level making conductive the TMOS $Q_1$ and bringing about the zeroing of $G_1$. Thus, $Q_R$ is transferred from $G_1$ to $G_o$, $G_4$ is zeroed and a optional charge is transferred from $G_4$ to $G_3$.

Hereinafter the different sequences will be described starting from sequence $t_1$, sequence $t_o$ not taking place because charge $Q_R$ is beneath $G_o$. Thus, we have in succession:

sequence $t_1$: pre-charge at points A and P;
sequence $t_2$:
  transfer of $Q_R/2$ beneath $G_1$ and of $Q_R/2$ beneath $G_2$;
  transfer of $a_o Q_R$ from $G_3$ to $G_4$;
  reading of $a_o Q_R + Q_R/2$;
  comparison by the coder of $$V_{R1} = (a_o \cdot Q_R + Q_R/2)/C_A \text{ with } |V_X|$$

and determination of $a_1$.
sequence $t_3$:
  if $a_1 = 0$ removal of $Q_R/2$ from $G_2$ to $G_o$, $G_e$ and $D_e$;
  if $a_1 = 1$ transfer of $Q_R/2$ from $G_2$ beneath $G_3$;
sequence $t_4$:
  transfer of $Q_R/2$ from $G_1$ to $G_o$;
  transfer of $a_o Q_R$ from $G_4$ to $G_3$, giving the charge $a_o Q_R + a_1 Q_R/2$ beneath $G_3$.

The different sequences are thus described starting from $t_1$. For the determination of each coefficient $a_i$ it is therefore necessary to have a pre-charge sequence $t_1$ and three successive transfer sequences $t_2$, $t_3$, $t_4$, whereof some comprise a plurality of simultaneous transfers.

When all the coefficients have been determined charges are removed from $G_1$ to $G_o$, $G_e$ and $D_e$ and the charges stored beneath $G_4$ are transferred to $D_c$.

FIG. 2 relates to a diagrammatic representation of the analog-digital coder according to the invention. The charge transfer coded voltage generator and the CRD are connected in series and are symbolized by rectangles.

In accordance with the selected embodiment of the CTD with a channel N, the charges collected at point A of the CRD are electrons and therefore correspond to the processing of negative voltages $-V_R$ and $-V_{Ri}$.

The CRD output is connected to two sample and hold means which are symbolically represented by a switch $S_3$ and $S_4$, followed by a capacitor connected to earth $C_3$ and $C_4$.

It is obvious that in actual fact the switches of the sample and hold means are constituted in per se known manner by one or more switching MOS transistors.

Each sample and hold means is connected to one of the two inputs of a two-channel, capacitive voltage divider. One of the channels of this divider, in FIG. 1 the upper channel following switch $S_3$ and capacitor $C_3$, comprises a capacitor of value $2^k C$, whilst the other channel comprises a capacitor of value C.

The output of the divider is called R, i.e. the common point for the two capacitors C and $2^k C$.

It is known to construct such a capacitive divider in integrated form and with a high precision. Thus, the article which appeared in the IEEE Journal of Solid-State Circuits, volume SC 10, no. 6, December 1975, pp. 371 to 379 describes systems of integrated capacitors with weighted values for use in charge redistribution capacitive coders.

In the coder according to the invention the determination of the coefficients $a_o$ to $a_n$ making it possible to code each sample $V_x$ is carried out in two stages.

During the first stage the switch $S_3$ is closed, whilst switch $S_4$ is open. The reference charge quantity $2Q_R$ is introduced into the generator and the CRD successively transmits to the upper channel of the voltage divider, i.e. to capacitor $2^k C$, the voltages $-V_R$ and $-V_{Ri}$ with $i = 1$ to $k-1$.

On coding voltage $V_x$ by using 12 coefficients $a_o$ to $a_n$; k is generally taken as equal to 6.

The voltages $-V_R$ and $-V_{R1}$ to $V_{R5}$ are thus successively transmitted to the capacitor $2^6 \cdot C$.

The voltage V at the output, i.e. at point R of the capacitive voltage divider is therefore successively equal to:

$$V = -V_R \cdot \frac{2^6}{1 + 2^6 + C_p/C} = -V_R \cdot \frac{2^6}{K} \text{ with}$$

$$K = 1 + 2^6 + C_p/C$$

$$V = -V_{Ri} \cdot \frac{2^6}{K},$$

with $i = 1$ to 5, in which $C_p$ represents the total stray capacitance at point R, which is represented by dotted lines in FIG. 2.

During the second stage switch $S_3$ is open, whilst switch $S_4$ is closed.

It is pointed out that the capacitor $C_3$ of the sample and hold means of the upper channel remains charged to the final voltage $-V_{R5}$ transmitted b the CRD during the first stage.

A new reference charge quantity $2Q_R$ is introduced into the generator and the CRD then successively transmits to the lower channel of the voltage divider, i.e. to capacitor C, the voltages $-V_R$ and $-V_{Ri}$ with $i = 1$ to $n-k$.

With the numerical example referred to hereinbefore where n equals 11 (because there are 12 coefficients $a_o$ to $a_n$) and in which k is equal to 6, it is the voltages $-V_R$ and $-V_{Ri}$ with i=1 to 5, which are successively transmitted to capacitor C.

The voltage V at the output of the divider is therefore successively equal to:

$$V = -V_{R5} \cdot \frac{2^6}{K} - V_R \cdot \frac{1}{K} \text{ and } V = -V_{R5} \cdot \frac{2^6}{K} - V_{Ri} \cdot \frac{1}{K}$$

with i=1 to 5.

It is apparent that the second term of these two equations is constituted by voltages processed by the generator during the second stage, which are multiplied by 1/X. The voltages processed by the generator during the second stage are therefore divided by $2^6$ compared with those processed by the generator during the first stage, which appeared at point R multiplied by the coefficient $2^6/K$.

The voltage V at the output of the divider can therefore be written:

$$V = -V_{R5} \cdot \frac{2^6}{K} - \frac{V_R}{2^6} \cdot \frac{2^6}{K} = -V_{R6} \cdot \frac{2^6}{K}$$

$$V = -V_{R5} \cdot \frac{2^6}{K} - \frac{V_{Ri}}{2^6} \cdot \frac{2^6}{K} = -V_{Ri} \cdot \frac{2^6}{K}$$

$$i = 1 \text{ to } 5 \quad i = 7 \text{ to } 11$$

It is therefore apparent that during the first stage the voltages:

$$V = -V_R \cdot 2^6/K \text{ and } V = -V_{Ri} \cdot 2^6/K$$

are obtained at the output of the divider at point R, with i=1 to 5 and during the second stage the voltages:

$$V = -V_{Ri} \cdot 2^6/K$$

are obtained at the output of the divider at point P with i=6 to 11.

Thus, to within the coefficient $2^6/K$ the voltages $V_R$ and $V_{Ri}$ are obtained with i=1 to 11 and these voltages make it possible to determine the coefficients $a_o$ to $a_n$.

The output of the capacitive voltage divider, i.e. point R is connected at a point Q to the output of a polarity reversal device, constituted by an amplifier able to assume two different gains +1 and -1. This device receives the voltage $V_x$ to be coded. Initially the coder according to the invention determines (it would be apparent in which way this is carried out hereinafter) the sign bit $a_s$ of each sample $V_x$ to be coded:

$a_s = 1$ if $V_x > 0$ $a = 0$ if $V_x < 0$

In the case where $a_s = 0$, i.e. $V_x$ is negative, the reversal device receives the order to reverse the polarity of $V_x$ and assumes the gain $-1$. At the output of the reversal device when the sign bit $a_s$ has been determined we obtain $|V_x|$.

Thus, at point Q voltage $|V_x| - V_R \cdot 2^6/K$ $|V_x| - V_{Ri} \cdot 2^6/K$ with i=1 to 11, is obtained.

Thus, it is easy to apply to $V_x$ the same coefficients $2^6/K$ as at $V_R$ and $V_{Ri}$, which can be carried out by a variable gain amplifier.

A follow-up stage, constituted in per se known manner by a differential amplifier A is connected to point Q. This stage limits the attenuation due to the stray capacitance $C_p$ at point Q and protects the latter which is a high impedance floating point against switching interference introduced by switches $S_5$ and $S_6$.

To the output of the follow-up stage are connected two sample and hold means represented in the same symbolic manner as the two previously used by a switch $S_5$, $S_6$, followed by a capacitor $C_5$, $C_6$ connected to earth. Each sample and hold means is connected to one of the two inputs $e_1$ and $e_2$ of a comparator. In FIG. 2 the sample and hold means constituted by switch $S_5$ and capacitor $C_5$ is connected to comparator input $e_1$.

This comparator supplies a 1 if the voltage applied to its input $e_1$ is greater than that applied to its input $e_2$ and a 0 in the opposite case.

This comparator is realized in per se known manner by a system of MOS transistors and capacitors.

Finally the comparator output is connected to a memory constituted by a type D flip-flop or a shift register in which are stored the values of the sign bit $a_s$, then coefficients $a_o$ to $a_n$.

Hereinafter the manner in which the sign bit $a_s$ is determined will be considered.

The polarity reversing device of $V_x$ comprises two switches $S_1$ and $S_2$. Switch $S_1$ is in series with the input of the reversing device and switch $S_2$ is connected between the input thereof and earth.

For the determination of $a_s$ switch $S_1$ is open and switch $S_2$ closed. The input of the reversing device is consequently short-circuited. The reversing device is at gain $+1$ and transmits its offset voltage to point Q.

Moreover, switches $S_3$, $S_4$ and $S_6$ are closed, whilst switch $S_5$ is open. The timing signals are applied to the voltage generator and to the CRD, but the injection of charges is inhibited. Thus, capacitor $C_6$ is charged with the offset voltages of the different circuits of the coder, with the exception of the comparator and the memory. These circuits are generally constructed according to MOS technology and it is particularly important to take account of the offset voltages.

Moreover, at the output of the CRD there is a mean voltage $V_{PO}$ corresponding to the average polarization level of the CRD prior to the introduction of the reference charge quantity $2Q_R$. This voltage is applied to one of the terminals of capacitors $2^kC$ and C.

Once capacitor $C_6$ has been charged switches $S_2$ and $S_6$ are opened and switches $S_1$ and $S_5$ closed. The mean voltage $V_{PO}$ continues to be applied to capacitors $2^kC$ and C. Voltage $V_x - V_{PO}$ added to the offset voltages charges capacitor $C_5$ and is applied to the input $e_1$ of the comparator which deducts therefrom the sign bit $a_s$.

In the case where $a_s = 0$ and where it is therefore necessary to pass the gain of the reversing device from 30 1 to $-1$, capacitor $C_6$ is discharged and is recharged with the offset voltages of the different circuits of the coder, with on this occasion the gain of the reversing device at $-1$.

When capacitor $C_6$ is charged with these offset voltages it is optionally possible to check that the sign bit $a_s$ is equal to 0.

Once the sign bit $a_s$ has been determined a reference charge quantity $2Q_R$ is introduced into the coded voltage generator.

With the precautions taken it is only the voltage variations at the output of the CRD compared with the initial polarization $V_{PO}$ which are transferred at Q. Thus, the value $V_{PO}$ is not involved in the determination of the coefficients, provided that it remains constant.

The way in which coefficients $a_s \ldots a_n$ are determined will now be examined.

It has been seen hereinbefore that at point Q the voltages $|V_x| - V_R \cdot 2^6/K$ and $|V_x| - V_{Ri} \cdot 2^6/K$ with $i=1$ to 11, are obtained.

Switches $S_2$ and $S_6$ are open, whilst switches $S_1$ and $S_5$ are closed. Furthermore, switch $S_3$ or switch $S_4$ is closed, depending on whether it is the first or second stage of the processing of voltages $V_R$ and $V_{Ri}$.

The voltages $|V_x| - V_R \cdot 2^6/K$ and $|V_x| - V_{Ri} \cdot 2^6/K$ therefore charge capacitor $C_5$, whilst capacitor $C_6$ is still charged with the offset voltages of the coder.

As capacitor $C_5$ is charged with the voltage $|V_x| - V_{Ri} \cdot 2^6/K$ switch $S_5$ is opened. The comparator then determines coefficient $a_i$, which is stored in the memory. The information on the value of the coefficients is transmitted to the generator. For $a_i=0$ the quantity of charges stored beneath $G_2$ is discharged to $D_e$, whilst it is stored beneath $G_3$ to contribute to the processing of $V_{Ri+1}$ if $a_i=1$. Switch $S_5$ is then again closed, so that $C_5$ is charged with $|V_x| - V_{Ri+1} \cdot 2^6/K$ and $a_i+1$ is determined.

All the circuits of the coder, i.e. the reversing device, the sample and hold means, the capacitive voltage divider, the follow-up stage, the comparator and the memory are preferably constructed in accordance with N MOS or C MOS technology compatible with the construction of the charge transfer coded voltage generator. Thus, these circuits are essentially constituted by elements which can best be constructed by MOS technology, i.e. MOS capacitors and transistors. In particular all the switches $S_1$ to $S_6$ are constituted by one or more MOS transistors.

The coder according to the invention carries out the digital coding of an analog signal by using a linear law. By associating therewith a digital transcoding making it possible to pass from a linear law to a logarithmic law it is possible, for example, to construct a logarithmic coder in accordance with law A or law $\mu$, which are standardized for the coding of voice signals.

It is obviously possible to use the generator of FIG. 1 for obtaining an analog-digital decoder. In this case the coefficients $a_0 \ldots a_n$ are known, there is no $V_x$ and the decoder makes it possible to process the analog voltage:

$$V_x = a_0 \cdot V_R + a_1 \cdot V_R/2^4 \ldots + a_n \cdot V_R/2^n$$

In this case the TMOS $Q_1$ is only connected to grid $G_1$ and the remainder of the CRD is only connected to grid $G_4$.

A single reading of the charges stared beneath $G_4$ is then necessary for the processing of the series of coefficients $a_0 \ldots a_n$. This reading takes place by the transfer of charges from $G_3$ to $G_4$, whilst the quantity of charges $$a_0 \cdot Q_R + a_1 \cdot Q_R/2 + \ldots + a_n \cdot Q_R/2^n$$

has been stored beneath $G_3$.

It is obvious to carry out a two-stage decoding in the manner described hereinbefore for the coding operation.

During the first stage the values equal to 0 or 1 of the coefficients $a_0$ to $a_{k-}$ are introduced into the generator. The quantity of charges stored beneath $G_4$:

$$a_0 \ldots Q_R + a_1 \cdot Q_R/2 + \ldots + a_{k-1} \cdot Q_R/2^{k-1}$$

is read. This reading voltage $V_1$ charges capacitor $C_3$ of the sample and hold means connected to capacitor $2^k C$. The charges are then removed from the generator and a new reference charge quantity is introduced into the generator.

During the second stage the values of coefficients $a_k$ to $a_n$ are introduced into the generator. This is followed by the reading of the quantity of charges stored beneath $G_4$: $a_k \cdot Q_R + a_{k+1} \cdot Q_R/2 + \ldots$. This reading voltage $V_2$ then charges the capacitor $C_4$ of the sample and hold means connected to capacitor C.

At the output of the voltage divider at point P the voltage V equals, to within the sign (depending on whether the CRD gives a negative reading or not):

$$V = V_1 \cdot 2^k/K + V_2 \cdot 1/K$$

Thus, the voltage $V_2$ is divided by $2^k$ compared with $V_1$ and the voltage V obtained corresponds to the reading, to within the coefficient $2^k/K$:

$$a_0 \cdot Q_R + a_1 \cdot Q_R + a_1 \cdot Q_R/2 + \ldots + a_n \cdot Q_R/2^n$$

A polarity reversing device positioned at the output and controlled by the sign bit $a_s$ of the coded word makes it possible to restore the magnitude and sign of the analog voltage $V_x$.

Reference has been made hereinbefore to the performance of the two-stage coding or decoding, but it is obviously possible to use three, four or in general p stages.

What is claimed is:

1. An analog-digital coder comprising charge transfer coded voltage generator means for determining by successive approximations coefficients $a_0 \ldots a_n$, equal to 0 or 1 of an analog voltage Vx to be coded with said analog voltage Vx coded in the form $$|Vx| = ao \cdot VR + a1 \cdot \frac{VR}{2} + a2 \cdot \frac{VR}{2^2} + \ldots + an \cdot \frac{VR}{2^n}$$

in which VR is a reference voltage; said generator means including means for carrying out said coding in two stages, said carrying out means during the first stage for processing the voltages VR and VRi, $$VRi = ao \cdot VR + a1 \cdot \frac{VR}{2} + a2 \cdot \frac{VR}{2^2} + \ldots + ai - 1 \cdot \frac{VR}{2^{i-1}} + \frac{VR}{2^i},$$

with $i=1$ to k, and k is approximately $=(n+1)/2$; said carrying out means for processing during the second stage for processing the voltages VR and VRi with $i=n$ to $(n-k)$, means for dividing by $2^k$ the processed voltages and for summing said second processed and divided voltages with the final voltage VR $(k-1)$ produced during the first stage.

2. A coder according to claim 1, wherein the said means are constituted by two sample and hold means ($S_3$, $C_3$, $S_4$, $C_4$) and a two-channel capacitive voltage divider, each channel being connected to one of the sample and hold circuits, one of the channels comprising a capacitor of value $2^k C$, while the other channel comprises a capacitor of value C, the voltages processed by the generator during the first stage being transmitted to the capacitor of value $2^k C$, whilst the voltages processed by the generator during the second stage are transmitted to the capacitor of value C.

3. A coder according to claim 2, wherein the generator means comprises a charge reading device (CRD) which supplies voltages $-V_R$ and $V_{Ri}$ with i=1 to n.

4. A coder according to claim 3, wherein the output of the capacitive divider is connected to the output of a device to reverse the polarity of the voltage to be coded $V_x$.

5. A coder according to claim 4, comprising a comparator with two inputs $e_1$ and $e_2$, which supplies a 1 if the voltage applied to its input $e_1$ is greater than that applied to its input $e_2$ and a 0 in the opposite case.

6. A coder according to claim 5, wherein each input of the comparator is preceded by a sample and hold means ($S_5$, $C_5$, $S_6$, $C_6$), said sample and hold means having a common point connected to the output of a follow-up stage (A), whose input is connected at the common point (Q) to the outputs of the capacitive divider and the reversing device.

7. A coder according to claim 6, wherein it is constructed according to MOS technology.

8. A coder according to claim 6 comprising means for determination of a sign bit $a_S$ of the voltage $V_x$; said determination taking place in two stages: during the first stage, the capacitor ($C_6$) of the sample and hold means ($S_6$, $C_6$) connected to the input $e_1$ of the comparator is charged with the offset voltages of the different circuits; and during the second stage, voltage $V_x$ charges capacitor ($C_5$) of the sample and hold means ($S_5$, $C_5$) connected to the input $e_2$ of the comparator.

9. A coder according to claim 8, wherein the coefficients $a_0 \ldots a_n$ being determined by the comparator, and the capacitor ($C_5$) of the sample and hold means ($S_5$, $C_5$) connected to the input $e_1$ of the comparator is charged by the voltage $|V_x| - V_{Ri}$ and capacitor ($C_6$) of the sample and hold means ($S_6$, $C_6$) connected to the input $e_2$ of the comparator is charged by the offset voltages.

10. A coder according to claim 9, being constructed in accordance with MOS technology with a buried channel.

* * * * *